United States Patent
Hironaka et al.

(10) Patent No.: US 7,994,952 B2
(45) Date of Patent: Aug. 9, 2011

(54) CONVERTER, CONVERSION METHOD, PROGRAM, AND RECORDING MEDIUM

(75) Inventors: Satoshi Hironaka, Yamaguchi (JP); Tohru Kohda, Fukuoka (JP); Kazuyuki Aihara, Chiba (JP)

(73) Assignees: Japan Science and Technology Agency, Saitama (JP); Kyushu University, National University Corporation, Fukuoka (JP)

( * ) Notice: Subject to any disclaimer, the term of this patent is extended or adjusted under 35 U.S.C. 154(b) by 60 days.

(21) Appl. No.: 12/669,860

(22) PCT Filed: Jul. 17, 2008

(86) PCT No.: PCT/JP2008/062897
§ 371 (c)(1), (2), (4) Date: Jan. 20, 2010

(87) PCT Pub. No.: WO2009/014057
PCT Pub. Date: Jan. 29, 2009

(65) Prior Publication Data
US 2010/0207796 A1 Aug. 19, 2010

(30) Foreign Application Priority Data
Jul. 20, 2007 (JP) ................. 2007-189899

(51) Int. Cl.
*H03M 1/10* (2006.01)
(52) U.S. Cl. ........................................ 341/118; 341/144
(58) Field of Classification Search .................. 341/118, 341/120, 144
See application file for complete search history.

(56) References Cited

U.S. PATENT DOCUMENTS

| 5,099,450 A | * | 3/1992 | Berkling ................. 712/209 |
| 6,546,515 B1 | | 4/2003 | Vary et al. |
| 2008/0258949 A1 | * | 10/2008 | Galton et al. ................. 341/120 |

FOREIGN PATENT DOCUMENTS

JP 2001-196932 7/2001

OTHER PUBLICATIONS

Daubechies, I et al., A/D Conversion With Imperfect Quantizers, IEEE Transactions on Information Theory, Mar. 2006, vol. 52, No. 3, pp. 874-885.*

(Continued)

*Primary Examiner* — Howard Williams
(74) *Attorney, Agent, or Firm* — Rankin, Hill & Clark LLP

(57) ABSTRACT

Provided is a highly accurate converter and the like that makes up for the instability of circuit elements, by focusing on a relationship between the Markov chain and β conversion. A converter 1 that determines the decoded value of a sample value x based on L-bit number $b_i$ (i=1, ..., L) includes a decoding section 3 to determine the decoded value $x_D$ for $\gamma=1/\beta$ (where 1<β<2) using equation (eq 1). Further, the converter 1 also includes a matrix estimation section 5 to determine the Markov transition matrix based on $b_i$. Unlike a conventional method that pays attention to the lower limit of an interval, the decoding section 3 using equation (eq 1) pays attention to the center of the interval, and this point is a significant difference.

$$x_D = \sum_{i=1}^{L} b_i \gamma^i + \frac{\gamma^{L+1}}{2(1-\gamma)}. \qquad \text{(eq 1)}$$

7 Claims, 6 Drawing Sheets

OTHER PUBLICATIONS

Daubechies, I et al., Beta Expansions: A New Approach to Digitally Corrected A/D Conversion, IEEE International Symposium on Circuits and Systems, ISCAS 2002, May 2002, vol. 2 p. 784.*

Daubechies, I et al., Robust and Practical Analog-to-Digital Conversion With Exponential Precision, IEEE Transactions on Information Theory, vol. 52, No. 8, Aug. 2006, p. 3533.*

International Search Report for PCT/JP2008/062897 dated Sep. 2, 2008.

* cited by examiner

<Fig. 1>
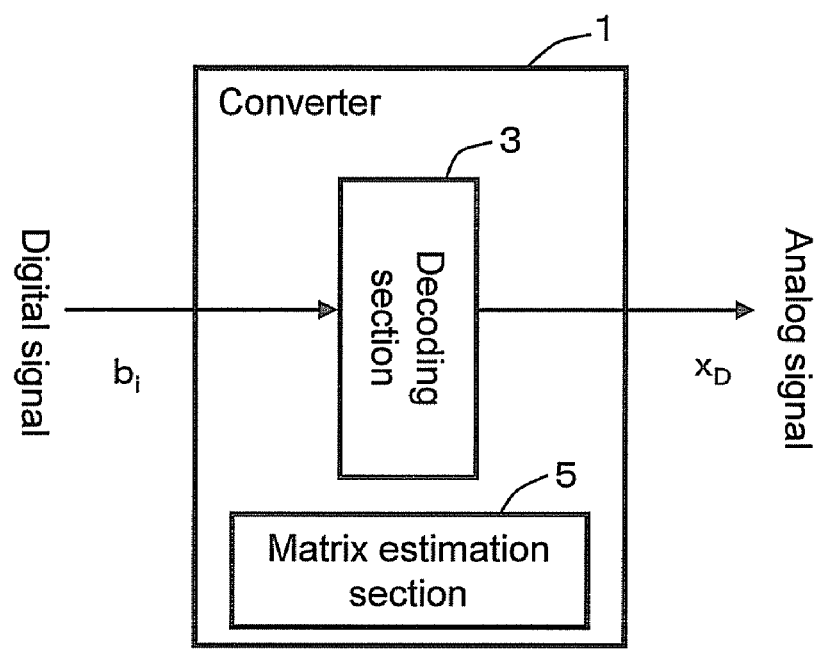

<Fig. 2>
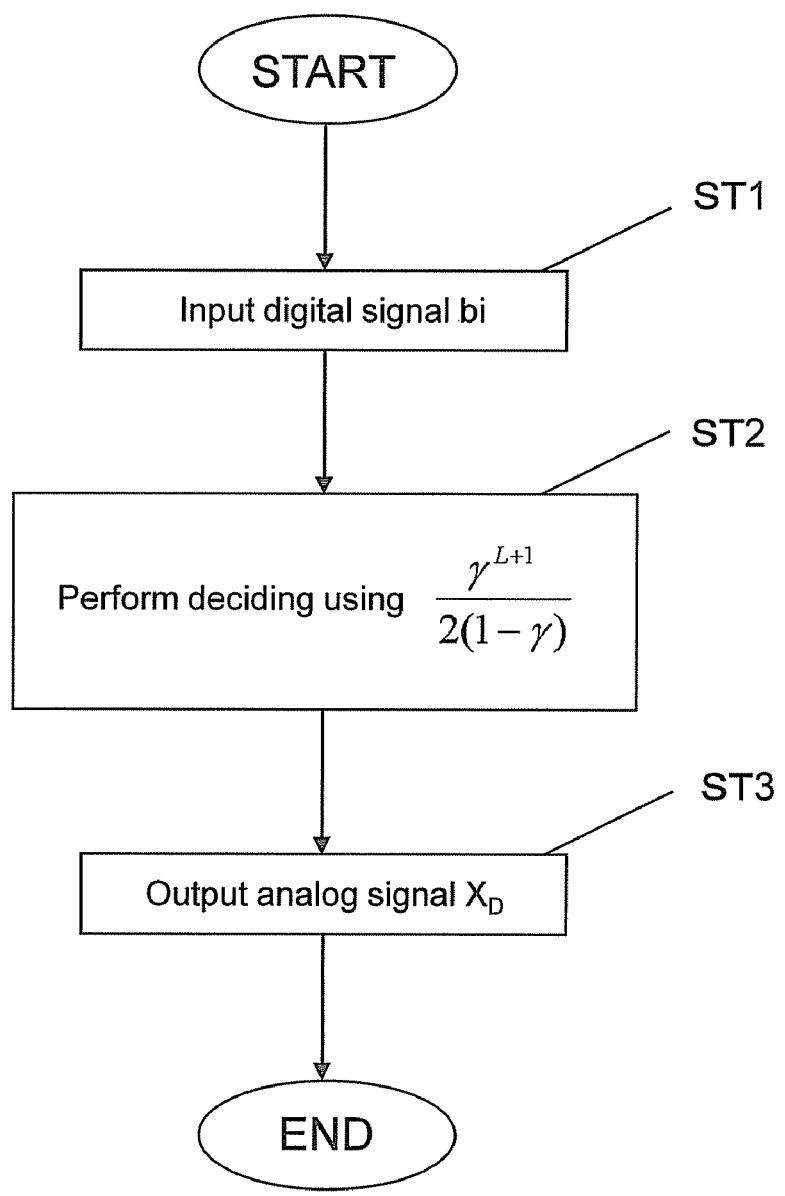

<Fig. 3>
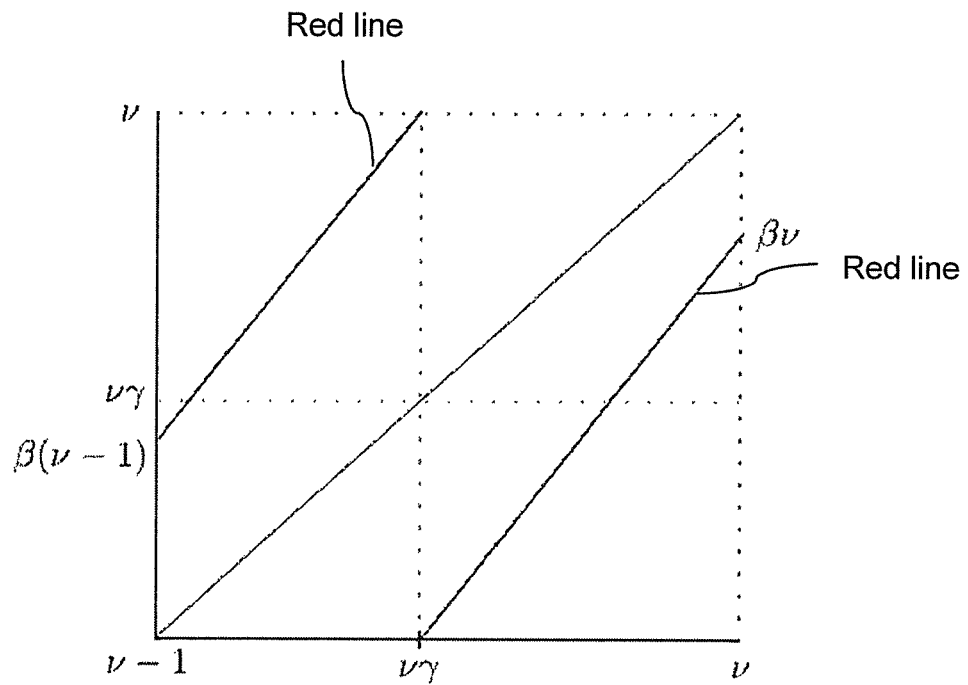
(a)
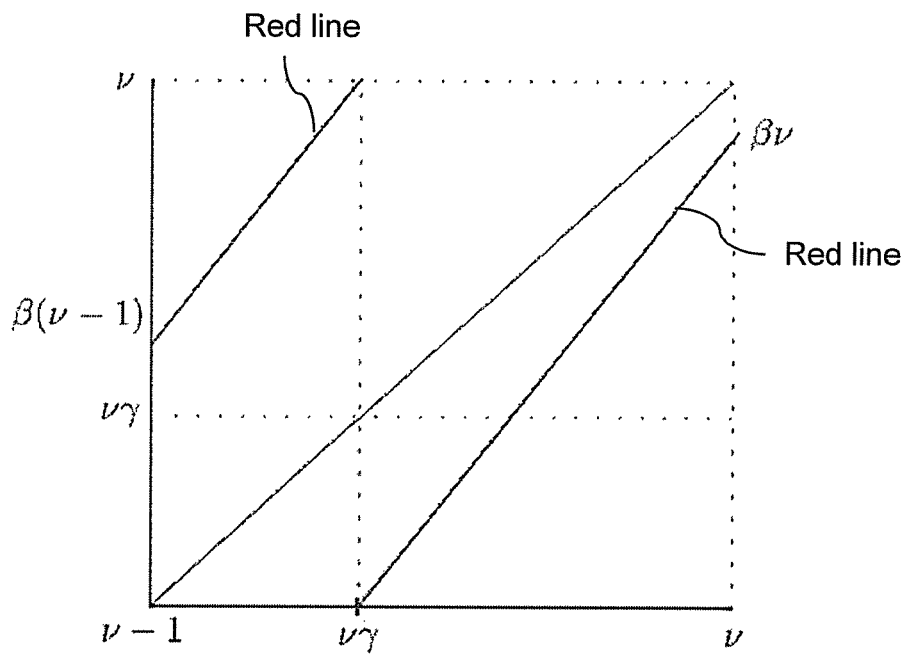
(b)

<Fig. 4>
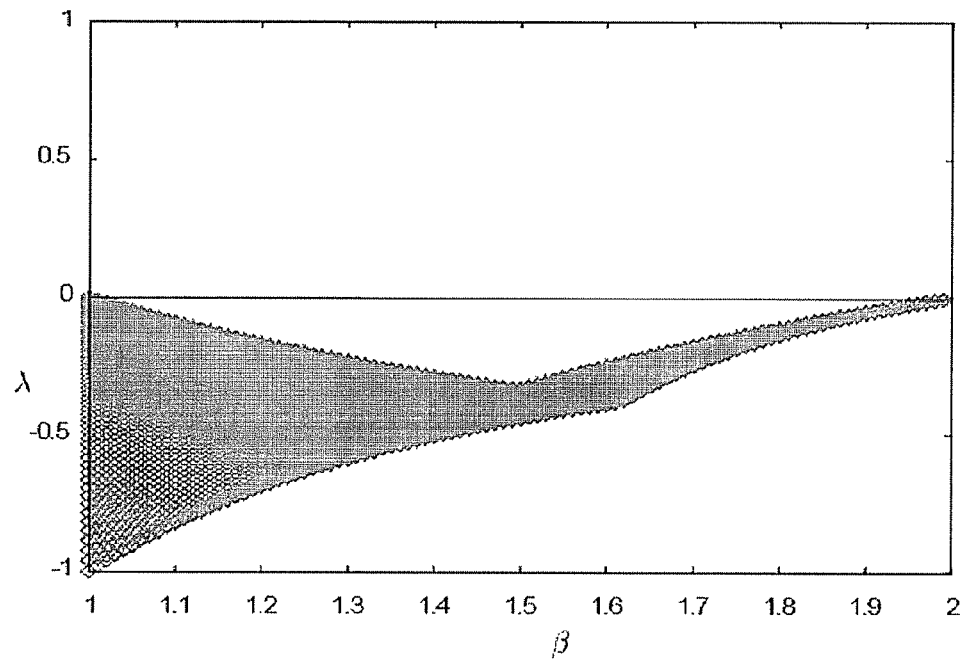
<Fig. 5>
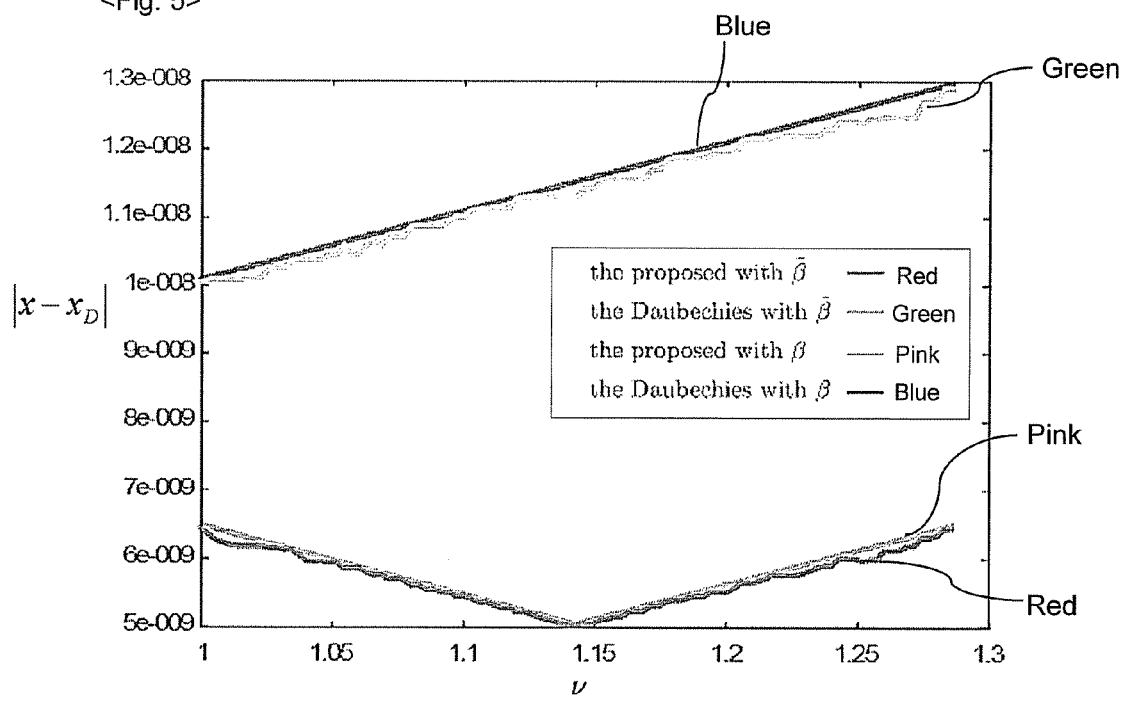

<Fig. 6>
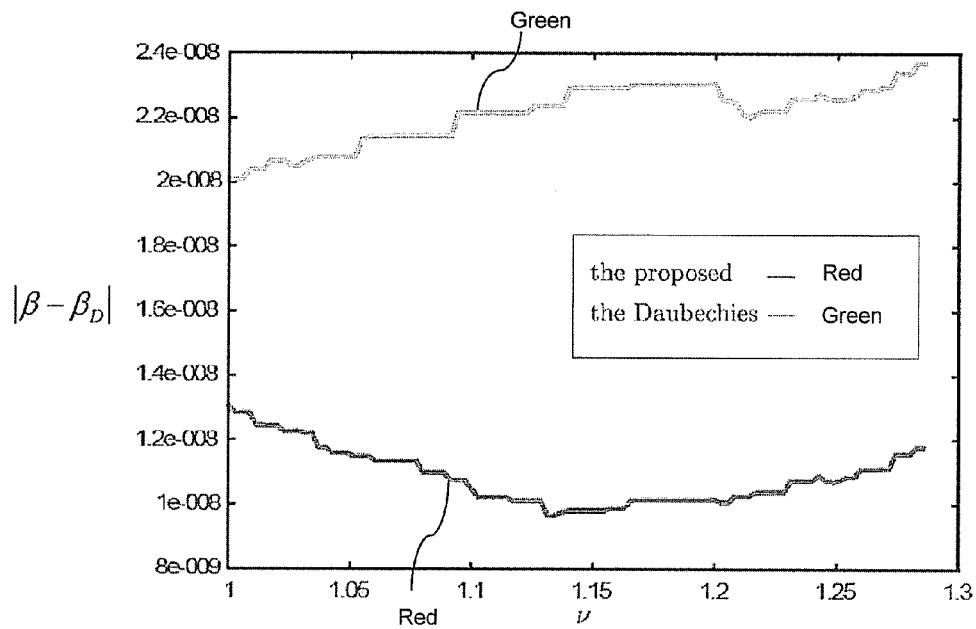
<Fig. 7>
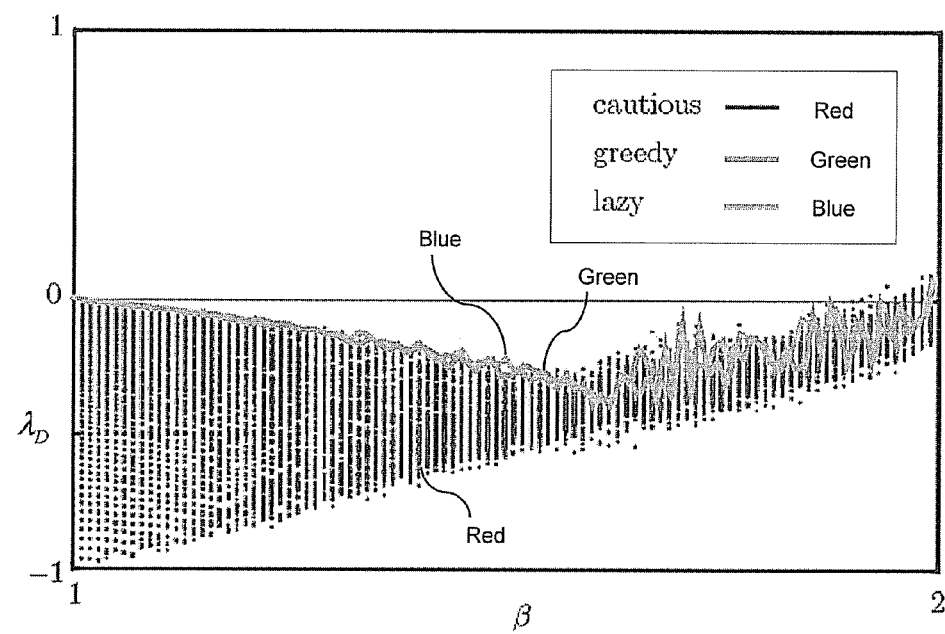

<Fig. 8>
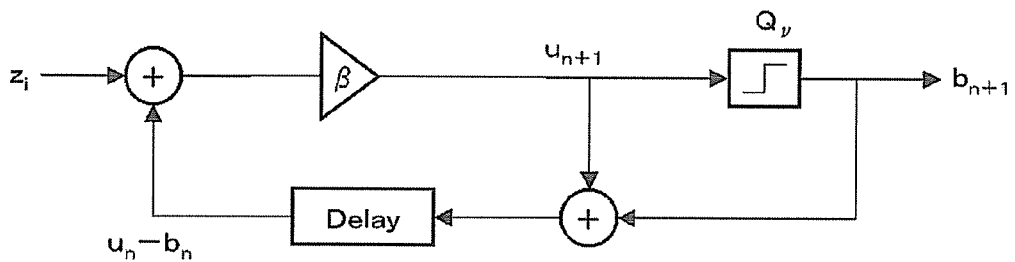
<Fig. 9>
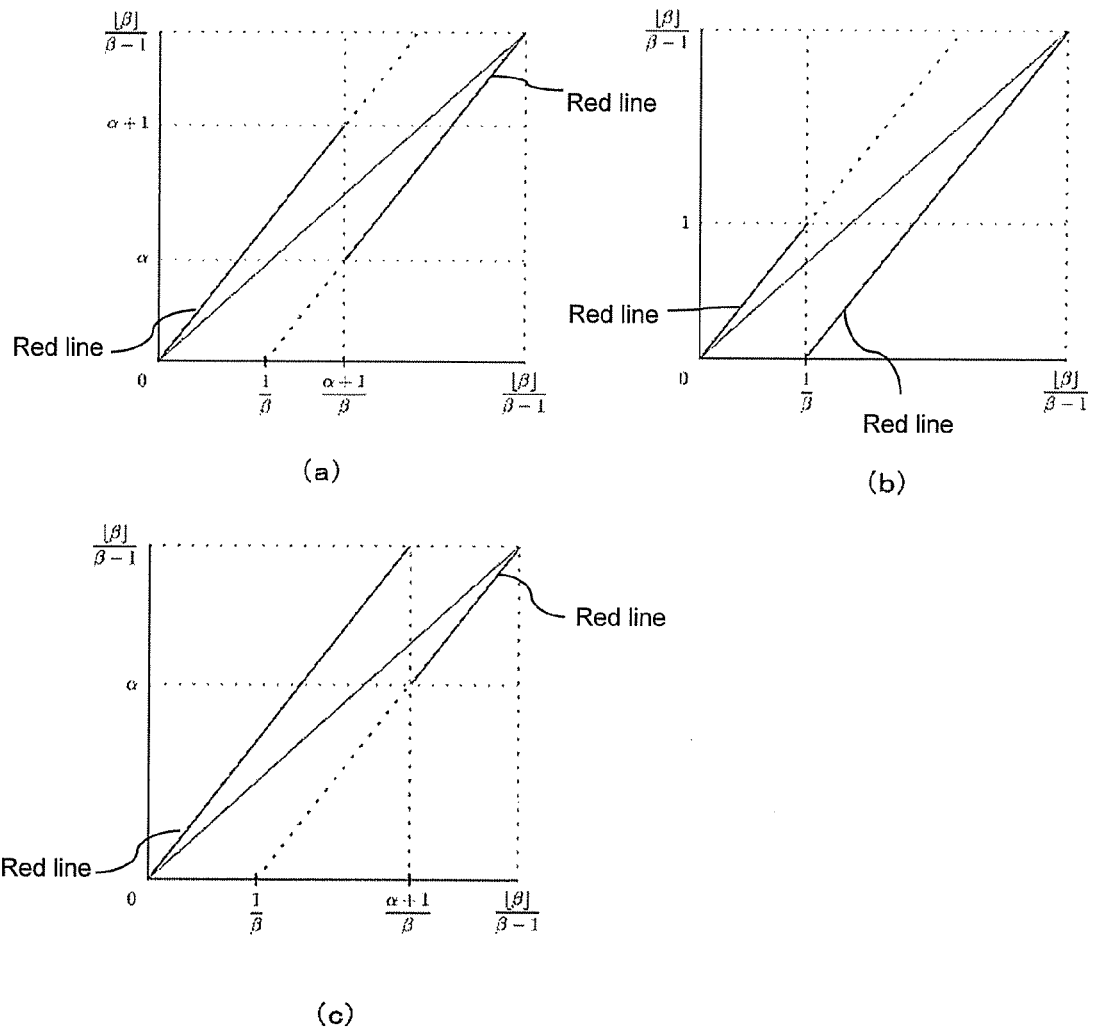
(a)
(b)
(c)

US 7,994,952 B2

CONVERTER, CONVERSION METHOD, PROGRAM, AND RECORDING MEDIUM

TECHNICAL FIELD

The present invention relates to a converter, a conversion method, a program, and a recording medium and, more particularly, to a converter and the like for performing conversion between a digital signal and an analog signal.

BACKGROUND ART

With spread of digital signal process in recent years, A/D (D/A) converting process is performed in various fields of sound process, image process, communication and the like. Since the precision of the converting process exerts an influence on a result of the sound process and the like, higher level is being continuously demanded. For example, one of methods having high precision is PCM (pulse-code modulation). The PCM, however, has a drawback such that the stability of circuit elements in an A/D converter is insufficient. One of methods realizing stability of operation is ΣΔ (sigma-delta) modulation (refer to Non-Patent Documents 1 to 7). There is also a technique called β conversion based on the sigma-delta modulation (refer to Patent Documents 8 and 9).

The β conversion will be described. When $\gamma=1/\beta$ (where $1<\beta<2$), $x \in (0, 1)$ is expressed by equation (1) using $b_i \in \{0, 1\}$. Here, $u_1=\beta y$, $b_1=Q_v(u_1)$, and $u_{i+1}=\beta(u_i-b_i)$, $b_{i+1}=Q_v(u_{i+1})$. $Q_v(z)$ denotes a quantizer and, for a threshold $v$ satisfying $v \in [1, (\beta-1)^{-1}]$, is 0 when $z<v$ and is 1 when $z \geq v$.

Equation 1

$$x = \sum_{i=1}^{\infty} b_i \gamma^i. \quad (1)$$

FIG. 8 is a diagram for explaining the structure of a β converter. When $z_0=y \in [0, 1)$ and $i>0$, $z_i=0$, and $u_0=b_0=0$. In the β converter, when $v=1$, the greedy" scheme has been proposed. When $v=(\beta-1)^{-1}$, the "lazy" scheme has been proposed.

When $\alpha=v-1$ in the above, it can be said that in the β conversion, the (β, α) expansions proposed by Dajani et al. are performed (refer to Non-Patent Document 10). In a map $N_{\beta,\alpha}$ of the (β, α) expansions with $\beta \in (1, 2)$, when $x \in [0, (\alpha+1)/\beta)$, $\beta x$ is derived. When $x \in [(\alpha+1)/\beta, 1/(\beta-1))$, $\beta x-1$ is derived.

FIG. 9(*a*) is a graph showing the map of the (β, α) expansion, FIG. 9(*b*) is a graph showing a "greedy" map when $v=1$, and FIG. 9(*c*) is a graph showing a "lazy" map when $v=(\beta-1)^{-1}$.

Non-Patent Document 1
Inose, H., and Yasuda, Y., "A unity bit coding method by negative feedback," Proceedings of the IEEE, vol. 51, no. 11, pp 1524-1535, November 1963

Non-Patent Document 2
J. Candy, "A Use of Limit Cycle Oscillation to Obtain Robust Analog-to-Digital Converters," Communications, IEEE Transactions on [legacy, pre-1988], vol. 22, no. 3, pp 298-305, March 1974

Non-Patent Document 3
Stephen H. Lewis, and Paul R. gray, "A pipelined 5-Msample/s 9-bit analog-to-digital converter," Solid-State Circuits, IEEE Journal of, vol. 22, no. 6, pp 954-961, December 1987

Non-Patent Document 4
Robert M. Gray, "Oversampled Sigma-Delta Modulation," Communications, IEEE transactions on [legacy, pre-1988], vol. 35, no. 5, pp 481-489, May 1987

Non-Patent Document 5
Robert M. Gray, "Spectral Analysis of Quantization Noise in a Single-Loop Sigma-Delta Modulator with dc Input," IEEE Transactions on communications, vol. 37, no. 6, pp 588-599, June 1989

Non-Patent Document 6
C. Gunturk, "On the robustness of single-loop sigma-delta modulation," IEEE Transactions on Information Theory, Vol. 47, no. 5, pp 1734-1744, 2001

Non-Patent Document 7
C. Gunturk, "One-Bit Sigma-Delta Quantization with Exponential Accuracy," Commun. Pure Applied Math., vol. 56, no. 11, pp 1608-1630, 2003

Non-Patent Document 8
I. Daubechies, R. Devore, C. Gunturk, and V. Vaishampayan, "A/D Conversion With Imperfect Quantizers," IEEE Transactions on Information Theory, vol. 52, no. 3, pp. 874-885, March 2006

Non-Patent Document 9
I. Daubechies, and O. Yilmaz, "Robust and Practical Analog-to-Digital Conversion With Exponential Precision," IEEE Transactions on information Theory, vol. 52, no. 8, pp. 3533-3545, August 2006

Non-Patent Document 10
K. Dajani, C. Kraaikamp, "From greedy to lazy expansions and their driving dynamics," Expo. Math, 2002

DISCLOSURE OF THE INVENTION

Problems to be Solved by the Invention

Although the β conversion has been studied mathematically as described above, study to apply it to A/D (D/A) converting process has been insufficient. In particular, there is still room for development for high precision required for converters and for making up the instability of circuit elements.

Therefore, an object of the present invention is to provide a high-precision converter and the like that makes up instability of circuit elements, by paying attention to the relation between the Markov chain and β conversion.

Means for Solving the Problems

A first aspect in accordance with the present invention provides a converter for determining a decoded value of a sample value x based on L-bit number $b_i$ (i=1, . . . , L), including decoding means for determining a decoded value $x_D$ for $\gamma=1/\beta$ (where $1<\beta<2$) by equation (eq 1).

A second aspect in accordance with the present invention provides the converter according to the first aspect, wherein when bit sequences obtained by β-converting $x \in (0, 1)$ and $y=1-x \in (0,1)$ are L-bit numbers $b_i$ and $c_i$ (i=1, . . . , L), respectively, a decoded value $x_D$ of $b_i$ is expressed by equation (eq 1), and a decoded value $y_D$ of $c_i$ is expressed by an equation derived by replacing $b_i$ in equation (eq 1) with $c_i$, γ is the root of an equation $P(\gamma)=0$ given by equation (eq 2).

A third aspect in accordance with the present invention provides the converter according to the first or the second aspect, including matrix estimating means, if $\beta/(\beta^2-1) \leq v < \beta^2/(\beta^2-1)$, for approximating a Markov transition matrix to equation (eq 3), if $v<\beta/(\beta^2-1)$, approximating a Markov transition matrix to equation (eq 4), and if $\beta^2/(\beta^2-1) \leq v$, approximating a Markov transition matrix to equation (eq 5).

A fourth aspect in accordance with the present invention provides the converter according to any of the first to the third aspects, including matrix estimating means for estimating a 2×2 Markov transition matrix of the β conversion by equation (eq 7) for $n_{00}$, $n_{01}$, $n_{10}$, and $n_{11}$ given by equation (eq 6).

A fifth aspect in accordance with the present invention provides a conversion method for performing conversion between a digital signal and an analog signal for determining a decoded value of a sample value x based on L-bit number $b_i$ (i=1, ..., L), including the step of making decoding means determine a decoded value $x_D$ for γ=1/β (where 1<β<2) by equation (eq 1).

A fifth aspect in accordance with the present invention provides a program for making a computer function as the converter according to any of the first to the fourth aspects.

A seventh aspect in accordance with the present invention provides a recording medium for recording the program according to the sixth aspect.

Equation 2

$$x_D = \sum_{i=1}^{L} b_i \gamma^i + \frac{\gamma^{L+1}}{2(1-\gamma)}, \quad \text{(eq 1)}$$

$$P(\gamma) = 1 - \sum_{i=1}^{N} (b_i + c_i)\gamma^i - \frac{\gamma^{N+1}}{(1-\gamma)} = 0, \quad \text{(eq 2)}$$

$$\begin{pmatrix} 1 - \frac{S}{\beta T} & \frac{S}{\beta T} \\ \frac{T}{\beta S} & 1 - \frac{T}{\beta S} \end{pmatrix}, \quad \text{(eq 3)}$$

$$\begin{pmatrix} 1 - \frac{S}{\beta T} & \frac{S}{\beta T} \\ 1 & 0 \end{pmatrix}, \quad \text{(eq 4)}$$

$$\begin{pmatrix} 0 & 1 \\ \frac{T}{\beta S} & 1 - \frac{T}{\beta S} \end{pmatrix}, \quad \text{(eq 5)}$$

$$n_{00} := \sum_{i=1}^{N-1} (1-b_i)(1-b_{i+1}), \quad n_{01} := \sum_{i=1}^{N-1} (1-b_i)b_{i+1},$$

$$n_{10} := \sum_{i=1}^{N-1} b_i(1-b_{i+1}), \quad n_{11} := \sum_{i=1}^{N-1} b_i b_{i+1}, \quad \text{(eq 6)}$$

$$\begin{pmatrix} \frac{n_{00}}{n_{00}+n_{01}} & \frac{n_{01}}{n_{00}+n_{01}} \\ \frac{n_{10}}{n_{10}+n_{11}} & \frac{n_{11}}{n_{10}+n_{11}} \end{pmatrix}, \quad \text{(eq 7)}$$

Effects of the Invention

With the present invention, a high-precision D/A converter or the like that makes up for the instability of circuit elements by interval analysis of β expansions can be proposed.

In the present invention, as a result of analyzing the β conversion as a Markov chain, it was found that a second eigenvalue is negative and that eigenvalues of greedy and lazy schemes are larger than that of any other map and are the same.

BRIEF DESCRIPTION OF THE DRAWINGS

FIG. 1 is a block diagram of a converter 1 according to an embodiment of the present invention.

FIG. 2 is a flowchart for explaining the operation of the converter of FIG. 1.

FIGS. 3(a) and 3(b) are diagrams showing the invariant subspace of β conversion.

FIG. 4 is a diagram showing a distribution of eigenvalues when a Markov transition matrix is approximated.

FIG. 5 is a diagram showing the worst precision of conversion when changing x and v for N=32 and β=1.77777.

FIG. 6 is a diagram showing a case where the precision of restoring the value of β from an output bit sequence is determined by the relation of γ=1/β and equations (11) and (12), and the proposed method and the method of Daubechies are compared.

FIG. 7 is a diagram showing an estimation result of a second eigenvalue.

FIG. 8 is a diagram for explaining the structure of a β converter.

FIG. 9(a) is a graph showing a map of a (β, α) expansion, FIG. 9(b) is a graph showing a "greedy" map when v=1, and FIG. 9(c) is a graph showing a "lazy" map when v=(β−1)$^{-1}$.

DESCRIPTION OF REFERENCE NUMERALS 1 converter
3 decoding section
5 matrix estimation section

BEST MODE FOR CARRYING OUT THE INVENTION

FIG. 1 is a block diagram of a converter 1 according to an embodiment of the present invention. FIG. 2 is a flowchart for explaining the operation of the converter 1 of FIG. 1. The converter 1 obtains a decoded value $x_D$ of a sample value x based on L-bit number $b_i$ (i=1, ..., L) (see steps ST1 and ST3 in FIG. 2). The converter 1 includes a decoding section 3 which obtains a decoded value $x_D$ for γ=1/β (where 1<β<2) using equation 2 (see step ST2 in FIG. 2). In the case of using equation 1 described in the prior art, attention is paid to the lower limit of an interval. In contrast, in the case of using equation 2, it is largely different with respect to the point that attention is paid to the center of an interval. The converter 1 also includes a matrix estimation section 5 for obtaining the Markov transition matrix based on $b_i$.

A conversion error of the converter 1 is expressed as equation 3 as described below.

First, an interval $I_i$ is defined as equation 4 (where $b_0$=0).

Subsequently, it is shown that $x \in I_i$ for all i. From $x \in (0, 1)$, $x \in I_0 = (0, (\beta-1)^{-1})$.

It is now supposed that $x \in I_i$. When $u_{i+1} < v$ as shown in equation 5, that is, when $b_{i+1}=0$, equation (6) is satisfied and $x \in I_{i+1}$. On the other hand, when $u_{i+1} \geq v$, that is, when $b_{i+1}=1$, equation (7) is satisfied and $x \in I_{i+1}$. Therefore, $x \in I_i$ is satisfied for all i.

Since it can be expressed that $x \in I_L$ and $(\beta-1)^{-1} = \sum_{i=1}^{\infty} \gamma^i$, a conversion error is expressed by equation (8)

Equation 3

$$x_D = \sum_{i=1}^{L} b_i \gamma^i + \frac{\gamma^{L+1}}{2(1-y)}, \quad (2)$$

$$0 \leq |x - x_D| \leq \frac{(\beta-1)^{-1}\gamma^L}{2}, \quad (3)$$

$$I_i = \left( \sum_{j=0}^{i} b_j \gamma^j, \sum_{j=0}^{i} b_j \gamma^j + \sum_{j=i+1}^{\infty} \gamma^j \right), \quad (4)$$

-continued $$u_{i+1} = \frac{x - \sum_{j=1}^{i} b_j \gamma^j}{\gamma^{i+1}},\quad (5)$$

$$x < \sum_{j=1}^{i} b_j \gamma^j + v\gamma^{i+1} \leq \sum_{j=0}^{i+1} b_j \gamma^j + \sum_{j=i+2}^{\infty} \gamma^j,\quad (6)$$

$$x \geq \sum_{j=1}^{i} b_j \gamma^j + v\gamma^{i+1} \geq \sum_{j=0}^{i+1} b_j \gamma^j,\quad (7)$$

$$0 \leq |x - x_D| \leq \frac{1}{2}\sum_{i=L+1}^{\infty} \gamma^i = \frac{(\beta-1)^{-1}\gamma^L}{2}.\quad (8)$$

According to the A/D conversion of Daubechies, et al., in the case where $\beta > 1.5$, an error which occurs in L-bit $\beta$ conversion is expressed by equation (9).

Equation 4

$$0 \leq x - \sum_{i=1}^{L} b_i \gamma^i \leq v\gamma^L.\quad (9)$$

Subsequently, a characteristic equation of $\beta$ will be described.

With reference to Daubechies et al, if bit sequences obtained by $\beta$-converting $x\epsilon(0,1)$ and $y=1-x\epsilon(0,1)$ are bi and ci (i=1, ..., N), respectively, each of the decoded values $x_D$ and $y_D$ are expressed by equation (10).

From $x_D + y_D = 1$, the estimated value of $\gamma$ is the root of a characteristic equation $P(\gamma) = 0$ of $\gamma$ given by equation (11).

The characteristic equation $P_{Dau}(\gamma)=0$ of Daubechies et al. is given by equation (12).

Equation 5

$$x_D = \sum_{i=1}^{N} b_i \gamma^i + \frac{\gamma^{N+1}}{2(1-\gamma)},\quad y_D = \sum_{i=1}^{N} c_i \gamma^i + \frac{\gamma^{N+1}}{2(1-\gamma)},\quad (10)$$

$$P(\gamma) = 1 - \sum_{i=1}^{N} (b_i + c_i)\gamma^i - \frac{\gamma^{N+1}}{(1-\gamma)} = 0,\quad (11)$$

$$P_{Dau}(\gamma) = 1 - \sum_{i=1}^{N} (b_i + c_i)\gamma^i = 0.\quad (12)$$

The Markov chain of binary sequences generated by $\beta$ conversion will now be described. Let $b_i$ (i=1, ..., N) be a binary sequence generated by $\beta$ conversion with $\beta$ and a threshold $v$.

It is shown here that an invariant subspace of the $\beta$ conversion denoted by $I=(\beta(v-1), \beta v)$ exists. There are two integers k and k' such that $u_i < u_{i+1} < \ldots < u_{i+k-1} < \beta(v-1) < u_{i+k}$ and $u_i > u_{i+1} > \ldots > u_{i+k'-1} < \beta v < u_{i+k'}$ are satisfied, which implies that $u_i \epsilon(\beta(v-1), \beta v)$. FIGS. 3(a) and 3(b) are diagrams each showing the invariant subspace of the $\beta$ conversion. FIG. 3(a) is a diagram showing the case where $\beta(v-1) \leq v\lambda$, and FIG. 3(b) is a diagram showing the case where $v < \lambda\beta(v-1)$.

The invariant space of the $\beta$ conversion exists. However, it is difficult to divide the subinterval into Markov partitions. Therefore, $b_i$ is approximated with a two-state Markov chain (1st-order Markov chain), and an eigenvalue of the Markov transition matrix is analyzed.

S and T are defined by equations (13) and (14), respectively. The matrix estimation section 5 in FIG. 1 approximates the transition matrix as follows.

If $\beta/(\beta^2-1) \leq v < \beta^2/(\beta^2-1)$, the transition matrix is approximated to become equation (15). Since S>0 and T>0, a second eigenvalue $\lambda$ satisfies the relation $\lambda<0$ from equation (16). A frequency distribution is given by an eigenvector for the eigenvalue 1, that is, equation (17).

If $v < \beta/(\beta^2-1)$, the transition matrix is approximated to become equation (18). The second eigenvalue $\lambda$ is expressed as $\lambda = -S/(\beta T) < 0$.

If $\beta^2/(\beta^2-1) \leq v$, the transition matrix is approximated to become equation (19). The second eigenvalue $\lambda$ is expressed as $\lambda = -T/(\beta S) < 0$.

Equation 6

$$S := \beta v - v > 0,\quad (13)$$

$$T := v - \beta(v-1)\quad (14)$$
$$= \beta - (\beta-1)v \geq \beta - 1 > 0,$$

$$\begin{pmatrix} 1 - \frac{S}{\beta T} & \frac{S}{\beta T} \\ \frac{T}{\beta S} & 1 - \frac{T}{\beta S} \end{pmatrix},\quad (15)$$

$$\lambda = 1 - \frac{1}{\beta}\left(\frac{S}{T} + \frac{T}{S}\right) \leq 1 - \frac{2}{\beta} < 0,\quad (16)$$

$$\left(\frac{T^2\beta^2}{S^2 + T^2\beta^2}, \frac{S^2}{S^2 + T^2\beta^2}\right),\quad (17)$$

$$\begin{pmatrix} 1 - \frac{S}{\beta T} & \frac{S}{\beta T} \\ 1 & 0 \end{pmatrix},\quad (18)$$

$$\begin{pmatrix} 0 & 1 \\ \frac{T}{\beta S} & 1 - \frac{T}{\beta S} \end{pmatrix}.\quad (19)$$

FIG. 4 is a diagram showing the distribution of eigenvalues when the Markov transition matrix is approximated. The second eigenvalue of the approximated transition matrix is negative.

The matrix estimation section 5 in FIG. 1 estimates a 2×2 Markov transmission matrix of the $\beta$ conversion with $b_i$ (i=1, ..., N). When $n_{00}$, $n_{01}$, $n_{10}$, and $n_{11}$ are defined by equations (20), an estimated Markov transition matrix is expressed by equation (21).

Equation 7

$$n_{00} := \sum_{i=1}^{N-1}(1-b_i)(1-b_{i+1}),\quad n_{01} := \sum_{i=1}^{N-1}(1-b_i)b_{i+1},\quad (20)$$

$$n_{10} := \sum_{i=1}^{N-1}b_i(1-b_{i+1}),\quad n_{11} := \sum_{i=1}^{N-1}b_i b_{i+1},$$

$$\begin{pmatrix} \frac{n_{00}}{n_{00}+n_{01}} & \frac{n_{01}}{n_{00}+n_{01}} \\ \frac{n_{10}}{n_{10}+n_{11}} & \frac{n_{11}}{n_{10}+n_{11}} \end{pmatrix}.\quad (21)$$

In the following, the conversion using the proposed algorithm will be compared with the method of Daubechies. The worst approximation error between x and the decoded value $x_D$ when moving x and a quantization threshold ν (cautious parameter) is criteria for evaluation. FIG. 5 is a diagram showing the worst precision of conversion when changing x and ν for N=32 and β=1.77777. It is understood from FIG. 5 that the precision of the proposed algorithm is superior to that of the algorithm of Daubechies when β=1.77777. It is also known that the cautious scheme has higher precision than the other scheme in the proposed algorithm.

FIG. 6 is a diagram showing a case where the precision of restoring the value of β from an output bit sequence is determined by the relation of γ=1/β, equations (11) and (12), and the proposed method and the method of Daubechies are compared. It is shown in the diagram that the β restoring precision of the proposed method is higher.

Estimation of a second eigenvalue of the two-state Markov transition matrix will now be described. By the β conversion with β∈(1,2), ν∈[1, (β−1)−1], and x∈(0, (β−1)−1), a binary bit sequence $b_i$ (i=1, ..., N) is outputted, and it is assumed that $b_i$ is a two-state Markov chain. At this time, a second eigenvalue can be estimated from $b_i$ by equation (21). FIG. 7 is a diagram showing a result of estimating a second eigenvalue. $\lambda_D$ is a second eigenvalue estimated from $b_i$ under condition that N=256 and x=ν−π/10. From the diagram, it is shown that most second eigenvalues are negative. It is understood from FIG. 7 that most $\lambda_D$ values obtained by the greedy and lazy schemes are larger than values obtained by the cautious scheme and are similar values.

From the above, as a result of analyzing the β conversion as the Markov chain, the second eigenvalue is negative, and the eigenvalues obtained by the greedy and lazy schemes are larger than those of the other scheme. The eigenvalues of the greedy and lazy schemes are similar to each other.

Preferably, a recommended value of the threshold is set to an intermediate value in a range from 1 to 1/(β−1) which is a permissible range of the parameter ν. The reason is that, although it is conventionally said that the restoration precision of the greedy scheme is higher than that of the lazy scheme, when ν=(1+1/(β−1))/2 is set, the restoration precision of the lazy scheme and that of the greedy scheme are equivalent, and excellent results are obtained from the viewpoint of the result of the precision and the viewpoint of robustness.

Hardware of the present invention can be realized by a configuration similar to that of FIG. 8 in spite of the difference of using equation (2) and the like.

The invention claimed is:

1. A converter for determining a decoded value of a sample value x based on L-bit number $b_i$ (i=1, ..., L),
comprising decoding means for determining a decoded value $x_D$ for γ=1/β (where 1<β<2) by equation (eq 1)

$$x_D = \sum_{i=1}^{L} b_i \gamma^i + \frac{\gamma^{L+1}}{2(1-\gamma)}. \quad (eq\ 1)$$

2. The converter according to claim 1, wherein when bit sequences obtained by β-converting x∈(0, 1) and y=1−x∈(0,1) are L-bit numbers $b_i$ and $c_i$ (i=1, ..., L), respectively, and when $x_D$, a decoded value of $b_i$, is expressed by equation (eq 1), and $y_D$, a decoded value of $c_i$, is expressed by an equation derived by replacing $b_i$ in equation (eq 1) with $c_i$, γ is the root of an equation P(γ)=0 given by equation (eq 2)

$$P(\gamma) = 1 - \sum_{i=1}^{N}(b_i + c_i)\gamma^i - \frac{\gamma^{N+1}}{(1-\gamma)} = 0. \quad (eq\ 2)$$

3. The converter according to claim 1, comprising matrix estimating means, if β/(β²−1)≦ν<β²/(β²−1), for approximating a Markov transition matrix to equation (eq 3), if ν<β/(β²−1), approximating a Markov transition matrix to equation (eq 4), and if β²/(β²−1)≦ν, approximating a Markov transition matrix to equation (eq 5)

$$\begin{pmatrix} 1-\frac{S}{\beta T} & \frac{S}{\beta T} \\ \frac{T}{\beta S} & 1-\frac{T}{\beta S} \end{pmatrix}, \quad (eq\ 3)$$

$$\begin{pmatrix} 1-\frac{S}{\beta T} & \frac{S}{\beta T} \\ 1 & 0 \end{pmatrix}, \quad (eq\ 4)$$

$$\begin{pmatrix} 0 & 1 \\ \frac{T}{\beta S} & 1-\frac{T}{\beta S} \end{pmatrix}. \quad (eq\ 5)$$

4. The converter according to claim 1, comprising matrix estimating means for estimating a 2×2 Markov transition matrix of the β conversion by equation (eq 7) for $n_{00}, n_{01}, n_{10}$, and $n_{11}$ given by equation (eq 6)

$$n_{00} := \sum_{i=1}^{N-1}(1-b_i)(1-b_{i+1}), \quad n_{01} := \sum_{i=1}^{N-1}(1-b_i)b_{i+1}, \quad (eq\ 6)$$

$$n_{10} := \sum_{i=1}^{N-1} b_i(1-b_{i+1}), \quad n_{11} := \sum_{i=1}^{N-1} b_i b_{i+1},$$

$$\begin{pmatrix} \frac{n_{00}}{n_{00}+n_{01}} & \frac{n_{01}}{n_{00}+n_{01}} \\ \frac{n_{10}}{n_{10}+n_{11}} & \frac{n_{11}}{n_{10}+n_{11}} \end{pmatrix}. \quad (eq\ 7)$$

5. A program for making a computer function as the converter of claim 1.

6. A recording medium for recording the program of claim 5.

7. A conversion method for performing conversion between a digital signal and an analog signal for determining a decoded value of a sample value x based on L-bit number $b_i$ (i=1, ..., L), comprising the step of making decoding means determine a decoded value $x_D$ for γ=1/β (where 1<β<2) by equation (eq 8)

$$x_D = \sum_{i=1}^{L} b_i \gamma^i + \frac{\gamma^{L+1}}{2(1-\gamma)}. \quad (eq\ 8)$$

* * * * *